United States Patent [19]

Kanno

[11] Patent Number: 5,696,353
[45] Date of Patent: Dec. 9, 1997

[54] FLEXIBLE CIRCUIT

[75] Inventor: Yoshinori Kanno, Tsukuba, Japan

[73] Assignee: Nippon Mektron, Ltd., Tokyo-to, Japan

[21] Appl. No.: 351,567

[22] Filed: Dec. 8, 1994

Related U.S. Application Data

[63] Continuation of Ser. No. 110,774, Aug. 23, 1993, abandoned.

[30] Foreign Application Priority Data

Feb. 3, 1993 [JP] Japan .................................. 5-16407

[51] Int. Cl.⁶ .................................................... H05K 1/00
[52] U.S. Cl. ........................ 174/254; 174/117 F; 439/493
[58] Field of Search ................................ 174/254, 255, 174/268, 72 TR, 117 F, 117 FF, 135, 88 R; 439/67, 77, 329, 445, 449, 493, 495, 496, 498; 361/826, 827

[56] References Cited

U.S. PATENT DOCUMENTS

Re. 33,604  6/1991  Gillett et al. .................... 439/329 X
3,629,787  12/1971  Wilson ............................... 439/67
4,019,798   4/1977  Zielnski ............................. 439/67
4,060,889  12/1977  Zielnski ....................... 174/117 R X
4,969,840  11/1990  Li et al. ........................... 439/77 X

FOREIGN PATENT DOCUMENTS 0243384  9/1989  Japan .................................. 439/493
0247985  10/1990  Japan .................................. 439/493

OTHER PUBLICATIONS

Burns et al., "Flexible Cable Support System", Feb. 1975. IBM Technical Disclosure Bulletin vol. 17, No. 9, p. 2751.

*Primary Examiner*—Hyung S. Sough
*Attorney, Agent, or Firm*—Foley & Lardner

[57] ABSTRACT

A flexible circuit has a backing including a reinforcement structure which has a cable retaining portion rising essentially perpendicular with respect to a backing surface, and a projection at a side face of the cable retaining portion for securing a cable extending from a circuit pattern to the cable retaining portion. The projection of the cable retaining portion is engaged with a hole of the cable at the location where said cable contacts the cable retaining portion.

6 Claims, 2 Drawing Sheets

FLEXIBLE CIRCUIT

This application is a continuation of application Ser. No. 08/110,774, filed Aug. 23, 1993, now abandoned.

INDUSTRIAL FIELD OF THE INVENTION

The present invention relates to a flexible circuit, and in particular to its cable supporting section.

DESCRIPTION OF THE PRIOR ART

As indicated in FIG. 4, the cable supporting section of a conventional flexible circuit of this type comprises a raised section 12 formed perpendicular to the edge of the rear backing 11 of a circuit pattern 21. The cable 22 from the circuit pattern 21 is connected to this raised section 12.

PROBLEMS RESOLVED BY THE INVENTION

When the cable 22 is connected to the raised section 12 in the above manner, since the cable 22 is firmly secured to the raised section 12, there is no degree of freedom. For this reason, when the flexible circuit is assembled into a product 30, as indicated in FIG. 4, and the cable 22 is connected to the raised section 12 in a manner deviating from a predetermined angle, undesirable effects such as contact with the inner wall of the product 30 or twisting of the cable can occur.

An object of the present invention is to provide a flexible circuit enabling a degree of freedom in the cable when securing to the cable retaining portion.

STEPS TO RESOLVING THE PROBLEMS

For achieving the above object, a flexible circuit in accordance with this invention comprises:

a backing means of reinforcing material having a cable retaining portion rising essentially perpendicular with respect to the backing means; and a projection on the side face of the cable retaining portion so as to allow securing the cable extending from the circuit pattern backed by the backing means;

whereby the cable has a hole for inserting the projection of the cable retaining portion at the portion where the cable contacts the cable retaining portion.

OPERATION

A hole is provided in the cable extending from the flexible circuit pattern at the location where the cable is secured to the cable retaining portion. By inserting the projection provided in the side face of the cable retaining portion into the hole, the cable and cable retaining portion are mutually secured. Because of the securing construction whereby the projection is inserted into the hole, the cable has a degree of freedom with respect to the cable retaining portion for allowing rotation centered on the hole.

EFFECTS OF THE INVENTION

As mentioned above, when securing the cable to the cable retaining portion of a flexible circuit in accordance with the present invention, the projection of the cable retaining portion is inserted into a hole provided in the cable or pin and secured so that the cable can be rotated. Consequently, in event the cable contacts the product using the flexible circuit, the cable can be rotated to change its direction so as to avoid contact. Also, a degree of freedom is given to the cable, and problems such as cable twisting can be avoided.

As a result, the operation of installing the flexible circuit into the product is made easier.

DESCRIPTION OF THE PREFERRED EMBODIMENTS

Figure 1A:
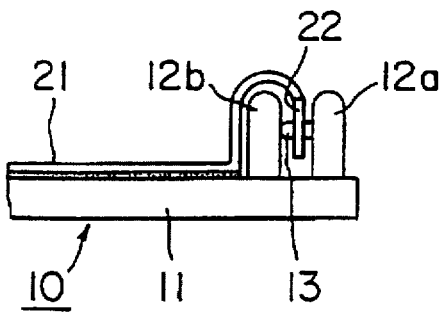
FIG. 1a indicates a lateral view and FIG. 1b indicates an oblique view of a first embodiment of this invention, FIG. 2a indicates a lateral view and FIG. 2b indicates an oblique view of a second embodiment of this invention, FIG. 3 indicates an oblique view of a conventional flexible circuit, and FIG. 4 indicates an example of a conventional flexible circuit when installed in a product.
Figure 1B:
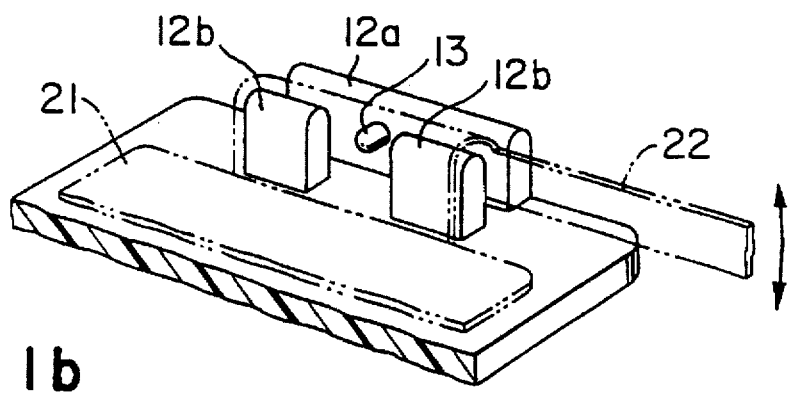

FIG. 1a indicates a lateral view and FIG. 1b indicates an oblique view of a first embodiment of this invention. In this embodiment, a cable 22 connected to the edge of a circuit pattern 21 is raised up from a reinforcement means 10 of a backing means 11 for backing a circuit pattern 21 and inserted in a space between a pair of cable retaining portions 12a and 12b. In addition a hole provided in the cable 22 is engaged with a projection 13 provided in a side face of the cable retaining portion 12b.

In other words, the cable 22 extends from the circuit pattern 21 and is raised upwards at the retaining portion 12a. The cable 22 is then inserted into the space between the pair of cable retaining portions 12a and 12b, and the hole of the cable 22 is engaged with the projection 13 provided at the side face of the retaining portion 12a.

As a result of this embodiment, the end of the cable 22 can be rotated about the projection 13. Moreover, with respect to the cable 22 long direction tension, the hole of the cable 22 is engaged with the projection 13, and the cable 22 is secured to the reinforcement means 10.

Figure 2A:
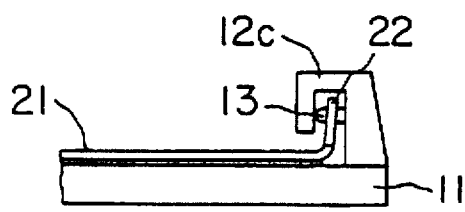
Figure 2B:
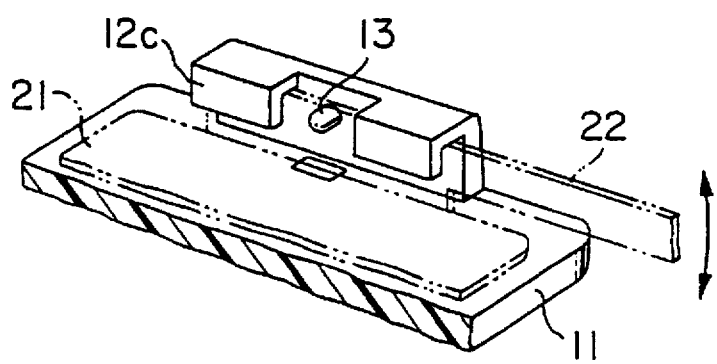
Figure 3:
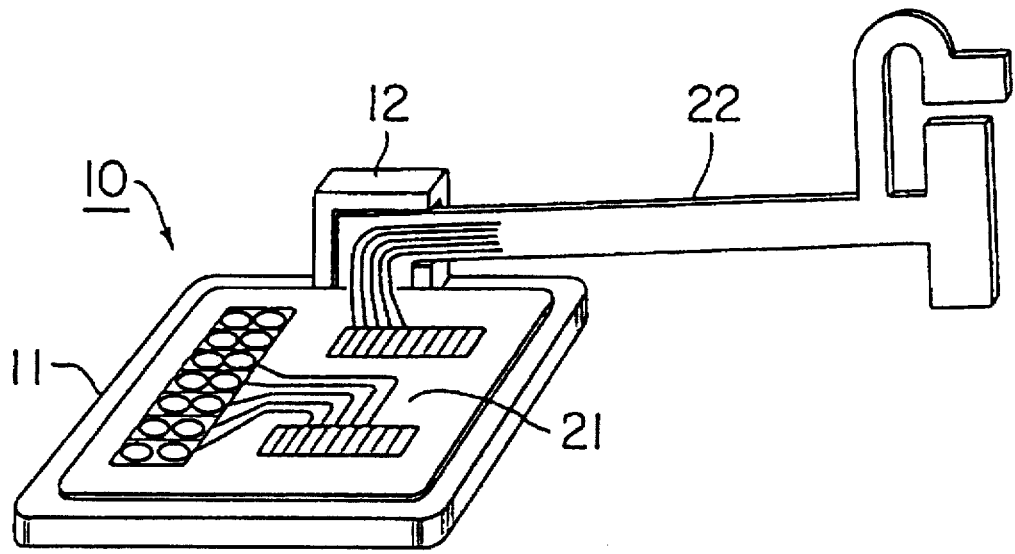
Figure 4:
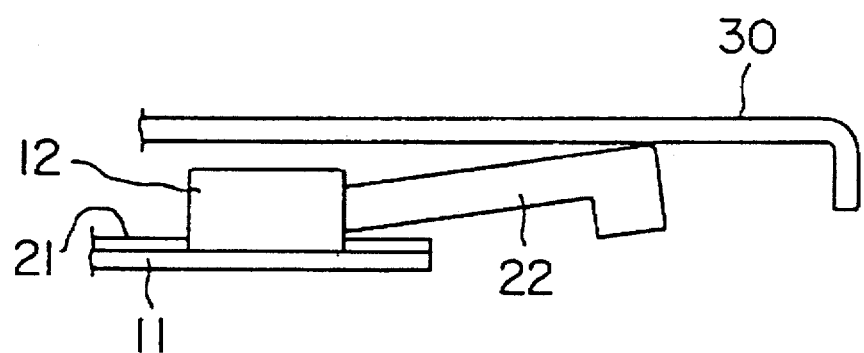

FIG. 2a indicates a lateral view and FIG. 2b indicates an oblique view of a second embodiment of this invention.

In this embodiment, a cable 22 provided at the edge of a circuit pattern 21 is partially enclosed by a cable retaining portion 12c provided with a folded back section raised from the reinforcing means 10 of the backing means 11 backing the circuit pattern 21.

In other words, in the FIG. 1 embodiment, the cable 22 is inserted into a space formed by the cable retaining portions 12a and 12b, but in the second embodiment of FIG. 2, the cable 22 is inserted in a space formed only by folding back the cable retaining portion 12c. In this case, the cable 22 hole is engaged with the projection 13 in the same manner as the first embodiment.

I claim:

1. A flexible circuit structure having a circuit pattern, comprising:

a flat cable connected to the circuit pattern, a reinforcement means having a cable retaining portion rising essentially perpendicularly with respect to a surface of the reinforcement means, and a projection means at a side face of said cable retaining portion for securing the flat cable extending from the circuit pattern to said cable retaining portion, said projection means projecting completely through a hole provided in said flat cable at a location where said flat cable contacts said cable retaining portion and allowing rotation of said flat cable with respect to said projection means.

2. A flexible circuit structure in accordance with claim 1 wherein said cable retaining portion is shaped so as to partially envelop said flat cable.

3. A flexible circuit structure in accordance with claim 1 wherein said cable retaining portion comprises a pair of members so as to clasp said flat cable in a thickness direction.

4. A circuit structure comprising:

a backing on which a circuit pattern is disposed;

a cable retaining portion rising essentially perpendicularly with respect to a surface of the backing on which the circuit pattern is disposed;

a flat cable connected to the circuit pattern; and a projection at a side face of the cable retaining portion for securing the flat cable, the projection extending completely through a hole provided in the flat cable and allowing the flat cable to be rotatable about the projection.

5. A circuit structure in accordance with claim 4 wherein the cable retaining portion is shaped so as to partially envelop the flat cable.

6. A circuit structure in accordance with claim 4 wherein the cable retaining portion comprises a pair of members so as to clasp the flat cable in a thickness direction.

* * * * *